United States Patent
Kwak

(10) Patent No.: US 6,175,524 B1
(45) Date of Patent: Jan. 16, 2001

(54) MERGED MEMORY AND LOGIC (MML) INTEGRATED CIRCUIT DEVICES INCLUDING BUFFER MEMORY AND METHODS OF DETECTING ERRORS THEREIN

(75) Inventor: Jin-seok Kwak, Kyungki-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/351,728

(22) Filed: Jul. 12, 1999

(30) Foreign Application Priority Data

Aug. 31, 1998 (KR) .................................................. 98-35722

(51) Int. Cl.$^7$ ...................................................... G11C 7/00
(52) U.S. Cl. ...................................... 365/189.05; 365/201
(58) Field of Search ............................... 365/201, 189.05; 714/7, 711, 710

(56) References Cited

U.S. PATENT DOCUMENTS

| | | | |
|---|---|---|---|
| 5,293,386 | 3/1994 | Muhmenthaler et al. | 371/21.1 |
| 5,315,553 | 5/1994 | Morris | 365/201 |
| 5,377,144 | 12/1994 | Brown | 365/189.02 |
| 5,465,257 | 11/1995 | Yamahata et al. | 371/22.5 |
| 5,483,493 | 1/1996 | Shin | 365/201 |
| 5,535,165 | 7/1996 | Davis et al. | 365/201 |
| 5,574,692 | 11/1996 | Dierke | 365/201 |
| 5,642,479 | 6/1997 | Flynn | 395/183.21 |
| 5,677,877 | 10/1997 | Yoon et al. | 365/189.02 |
| 5,848,016 | 12/1998 | Kwak | 365/201 |
| 5,926,420 | 7/1999 | Kim | 365/189.02 |
| 5,982,681 | * 11/1999 | Schwarz | 365/201 |
| 6,003,148 | * 12/1999 | Yamauchi et al. | 365/201 |
| 6,031,785 | * 2/2000 | Park et al. | 365/189.05 |

FOREIGN PATENT DOCUMENTS

| | | |
|---|---|---|
| 0 636 976 A1 | 2/1995 | (EP) . |
| 0 801 400 A1 | 10/1997 | (EP) . |
| 0 801 401 A1 | 10/1997 | (EP) . |
| 0 840 217 A1 | 5/1998 | (EP) . |
| 2 305 732 | 4/1997 | (GB) . |
| WO 98/12707 | 3/1998 | (WO) . |

* cited by examiner

Primary Examiner—Son T. Dinh
(74) Attorney, Agent, or Firm—Myers Bigel Sibley & Sajovec

(57) ABSTRACT

An MML integrated circuit device includes a memory block, a logic circuit and a buffer memory, and a selection circuit that is coupled between the logic circuit and the buffer memory. The first selection portion is responsive to external data and to the logic circuit, to transmit external data or data from the logic circuit to the memory block via the buffer memory. Thus, MML integrated circuit devices can use the buffer memory to access the memory block during a normal operational mode and during a test mode. MML integrated circuit devices also preferably include a data expansion portion that is coupled between the external data and the selection portion, to replicate the external data a predetermined number of times and to transmit the replicated external data to the selection portion. Errors may be detected in an MML integrated circuit device that includes a memory block, a logic circuit and a buffer memory, by storing external data from external of the MML integrated circuit device into the buffer memory, and storing the external data from the buffer memory into the memory block. The external data is read from the memory block and the read external data is stored from the memory block into the buffer memory. The read external data is output from the buffer memory to external of the MML integrated circuit device. The external data may be stored from external of the MML integrated circuit device into the buffer memory by applying external data from external of the MML integrated circuit device to the MML integrated circuit device, replicating the external data a predetermined number of times in the MML integrated circuit device and storing the replicated external data in the buffer memory.

22 Claims, 4 Drawing Sheets

MERGED MEMORY AND LOGIC (MML) INTEGRATED CIRCUIT DEVICES INCLUDING BUFFER MEMORY AND METHODS OF DETECTING ERRORS THEREIN

FIELD OF THE INVENTION

This invention relates to integrated circuit devices, and more particularly to Merged Memory and Logic (MML) integrated circuit devices and methods of testing the same.

BACKGROUND OF THE INVENTION

Integrated circuit devices, such as integrated circuit memory devices and integrated circuit logic devices, are widely used in consumer and commercial applications. Recently, Merged Memory and Logic (MML) integrated circuit devices have been developed. MML integrated circuit devices generally include a large capacity memory and a large logic block that are merged in one integrated circuit device. Thus, an MML integrated circuit device can replace discrete memory and logic chips that are used in personal computers and other consumer and commercial devices. MML devices are described, for example, in U.S. Pat. No. 5,848,016 to Kwak, entitled "Merged Memory and Logic (MML) Integrated Circuits and Methods Including Serial Data Path Comparing", and assigned to the assignee of the present application, the disclosure of which is hereby incorporated herein by reference.

MML integrated circuit devices may present new challenges for the testing thereof. In particular, an MML integrated circuit device generally provides a large number of internal data paths between the memory block and the logic block. For example, up to 256 or more internal data paths may be provided. Since many of these internal data paths are not brought out to external MML integrated circuit device pads, it may be difficult to access all of the internal data paths in order to test the memory block.

Stated differently, in order to test a conventional memory integrated circuit device, test equipment is coupled to the pads of the memory integrated circuit device. However, the memory block in an MML integrated circuit device may be difficult to test because the memory is connected to the external pads through the logic block.

It is also known to provide MML integrated circuit devices that include a buffer memory, generally having a smaller capacity than the memory block. The buffer memory is connected to the memory block and generally operates at a higher speed than the memory block. For example, the memory block may be a Dynamic Random Access Memory (DRAM) and more preferably a synchronous DRAM, and the buffer memory may be a Static Random Access Memory (SRAM). The buffer memory operates as a buffer between the memory block and the logic block. Thus, the memory block transmits and receives data only to and from the buffer memory. The logic block also transmits data to and receives data from the buffer memory.

In an MML integrated circuit device that includes a buffer memory between a memory block and a logic block, it may be difficult to test the memory block. In particular, in a conventional integrated circuit memory device, the memory cells of the memory device may be tested by directly accessing the memory from external of the integrated circuit memory device. It is known to use a multiplexer to select different modes, such as a normal operation mode, an external test mode and a Built-In Self-Test (BIST) mode, to directly access the memory.

In an MML integrated circuit device, when there are a large number of input and output data buses for the memory block, a large number of data buses may need to be added between the memory block and the buffer memory for normal operation and between the BIST circuit and the memory block for self-test. Moreover, a large number of data buses may need to be added between the multiplexer and the memory block in order to directly access the memory block from outside the MML integrated circuit device. The addition of these buses may unduly increase the size of the MML integrated circuit device. Moreover, it may be difficult to test the performance of the memory block during its normal operation when it is communicating only with the buffer memory.

SUMMARY OF THE INVENTION

It is therefore an object of the present invention to provide improved MML integrated circuit devices.

It is another object of the present invention to provide MML integrated circuit devices that need not unduly increase the area thereof to accommodate buses for testing.

It is still another object of the present invention to provide MML integrated circuit devices and methods of testing thereof that can detect errors in the memory block thereof when the memory block communicates with the logic block through a buffer memory.

These and other objects are provided, according to the present invention, by an MML integrated circuit device that includes a memory block, a logic block and a buffer memory, and a selection circuit that is coupled between the logic block and the buffer memory. The selection circuit is responsive to external data and to the logic block, to transmit the external data or data from the logic block to the memory block via the buffer memory. Thus, MML integrated circuit devices according to the invention can use the buffer memory to access the memory block during a normal operational mode and during a test mode.

MML integrated circuit devices according to the invention also preferably include a Built-In Self-Test (BIST) block that is coupled to the selection circuit to transmit BIST data to the memory block via the buffer memory. The selection circuit preferably includes a plurality of multiplexers, a respective one of which is coupled to the external data, to the logic block and to the BIST block.

The buffer memory generally is of smaller size than the memory block. MML integrated circuit devices according to the present invention preferably include a data expansion circuit that is coupled between the external data and the selection circuit, to replicate the external data a predetermined number of times and to transmit the replicated external data to the selection circuit.

A second selection circuit also may be included that is responsive to parallel data from the buffer memory, to sequentially select portions of the parallel data from the buffer memory and to sequentially output the selected portions of the parallel data to external of the MML integrated circuit device. A third selection circuit also may be included that is coupled to the logic circuit and to the second selection circuit, to select the output of the logic circuit or the sequentially selected portions of the parallel data from the second selection circuit, for output external of the MML integrated circuit device.

Errors may be detected in an MML integrated circuit device that includes a memory block, a logic block and a buffer memory, by storing external data from external of the MML integrated circuit device into the buffer memory, and storing the external data from the buffer memory into the memory block. The external data is read from the memory block and the read external data is stored from the memory block into the buffer memory. The read external data is output from the buffer memory to external of the MML integrated circuit device. The external data may be stored from external of the MML integrated circuit device into the buffer memory by applying external data from external of the MML integrated circuit device to the MML integrated circuit device, replicating the external data a predetermined number of times in the MML integrated circuit device and storing the replicated external data in the buffer memory.

The step of storing external data from external of the MML integrated circuit device into the buffer memory may be repeatedly performed to fill the buffer memory with the external data. Moreover, the step of storing the external data from the buffer memory into the memory block may be repeatedly performed to fill the memory block with the stored external data from the buffer memory. In order to output the read external data from the buffer memory to external of the MML integrated circuit device, portions of the read external data are sequentially selected from the buffer memory. The selected portions of the read external data are sequentially output to external of the MML integrated circuit device. Accordingly, MML integrated circuit devices that include buffer memories may be tested without the need to unduly increase the size of the MML integrated circuit device. A memory block may also be tested during a normal operation of interfacing with the buffer memory.

DETAILED DESCRIPTION OF PREFERRED EMBODIMENTS

Figure 1:
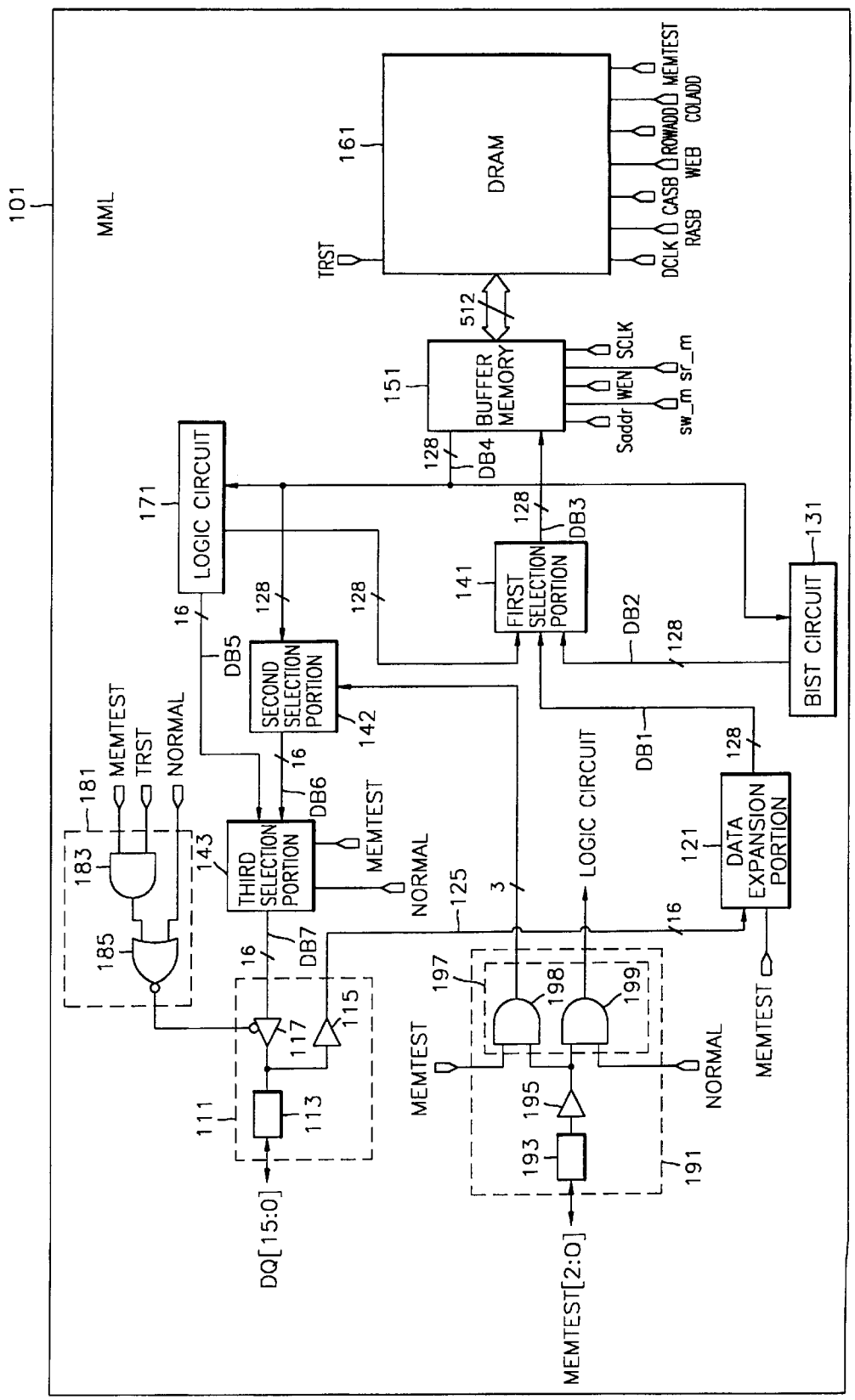
FIG. 1 is a block diagram of MML integrated circuit devices according to a preferred embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

FIG. 1 is a block diagram of MML integrated circuit devices according to the invention. Referring to FIG. 1, an integrated circuit device 101 according to an embodiment of the present invention includes a data input/output portion 111, a data expansion portion 121, a BIST circuit 131, first through third selection portions 141 through 143, a buffer memory 151 such as an SRAM, a memory block such as a synchronous DRAM 161, a logic block or logic circuit 171, an output control portion 181, and a selection control portion 191.

The external data input from external of the MML integrated circuit device is transmitted to the data expansion portion 121 through the data input/output portion 111. The data input/output portion 111 includes, for example, sixteen pads 113, sixteen input buffers 115, and sixteen output buffers 117. The sixteen input buffers 115 convert the voltage level of the data input through the sixteen input and output pads 113. For example, the sixteen input buffers 115 convert the voltage of a Transistor Transistor Logic (TTL) level into the voltage of a Complementary Metal Oxide Semiconductor (CMOS) level. In general, the voltage of the TTL level is 0 through 5.0 volts. The voltage of the CMOS level is 0 through 3.3 volts.

The sixteen output buffers 117 output the data from the third selection portion 143 in response to the output of the output control portion 181. Specifically, the sixteen output buffers 117 are activated when the output of the output control portion 181 is logic low and transmit the data output from the third selection portion 143 to the sixteen input/output pads 113. The sixteen output buffers 117 are deactivated when the output of the output control portion 181 is logic high and do not transmit the data output from the third selection portion 143 to the sixteen input/output pads 113. The sixteen output buffers 117 convert the voltage level of the data output from the third selection portion 143 when they are activated. For example, the sixteen output buffers 117 convert CMOS voltage levels into TTL voltage levels.

The data expansion portion 121 extends or replicates the data output from the data input/output portion 111 in response to an external control signal MEMTEST, and transmits the extended or replicated data to the first selection portion 141. The external control signal MEMTEST is activated only when the buffer memory 151 or the DRAM 161 is tested. For example, the data expansion portion 121 may be connected to the data input/output portion 111 through sixteen data buses 125 and to the first selection portion 141 through 128 data buses DB1. Therefore, the data expansion portion 121 copies sixteen bits or groups of data transmitted from the data input/output portion 111 eight times to extend to 128 bits or groups of data, and transmits the extended data to the first selection portion 141. The data expansion portion 121 extends the sixteen data bits or groups of bits to the 128 data bits or groups of bits in order to make the number of the data input to the first selection portion 141 equal to the number of the data output from the first selection portion 141. As shown in FIG. 1, there may be 128 data buses DB3 between the first selection portion 141 and the buffer memory 151.

The BIST circuit 131 tests the function of the buffer memory 151 and the DRAM 161. The BIST circuit 131 tests the buffer memory 151 through the first selection portion 141 and tests the DRAM 161 through the first selection portion 141 and the buffer memory 151. Specifically, in order to test the DRAM 161, the BIST circuit 131 stores data in the DRAM 161 through the first selection portion 141 and the buffer memory 151 and the data stored in the DRAM 161 is directly received through the buffer memory 151. The BIST circuit 131 transmits data to the first selection portion 141 through 128 data buses DB2.

The first selection portion 141 selects one of the data output from the data expansion portion 121, the data output from the BIST circuit 131, and the data output from the logic circuit 171 and transmits the selected data to the buffer memory 151. The first selection portion 141 preferably includes a plurality of multiplexers, each having three inputs and one output.

The buffer memory 151, for example an SRAM, stores the data received from the first selection portion 141 and transmits the data to the DRAM 161, or reads the data stored in the DRAM 161 and stores the read data in the buffer memory 151, in response to the control signals SCLK, Saddr, WEN, sw_m, and sr_m that are input from external of the MML device. The buffer memory 151 transmits the stored data to the logic circuit 171, the second selection portion 142, and the BIST circuit 131 in response to the control signals SCLK, Saddr, WEN, sw_m, and sr_m. The DRAM 161 reads the data stored in the buffer memory 151 and writes data stored in the DRAM 161 to the buffer memory 151 in response to control signals DCLK, MEMTEST, RASB, CASB, WEB, ROWADD, and COLADD that are input from external of the MML device.

The number of the input and output data buses of the buffer memory 151 which communicate with the first selection portion 141 preferably is smaller than the number of the input and output data buses of the buffer memory 151 which communicate with the DRAM 161. For example, there may be 128 input and output data buses of the buffer memory 151 which communicate with the first selection portion 141 and 512 input and output data buses of the buffer memory 151 which communicate with the DRAM 161. The buffer memory 151 and the DRAM 161 will be described in detail with reference to FIG. 2.

The logic circuit 171 receives data from the buffer memory 151 and controls the operations of the buffer memory 151 and the DRAM 161 through the first selection portion 141. The logic circuit 171 receives data from the buffer memory 151 through 128 data buses DB4 and transmits the data to the third selection portion 143 through sixteen data buses DB5.

A selection control portion 191 combines control signals MEMTEST and NORMAL that are input from external of the MML device and controls the logic circuit 171 and the second selection portion 142. The selection control portion 191 includes, for example, three pads 193, three buffers 195, and a logic portion 197. The three buffers 195 convert the voltage levels of the external control signals MEMTEST input through the three pads 193. For example, the three buffers 195 convert TTL voltage levels into CMOS voltage levels. The logic portion 197 combines the control signals MEMTEST that are output from the three buffers 195 and controls the operations of the logic circuit 171 and the second selection portion 142. The logic portion 197 includes an AND gate 198 for performing an AND operation on the control signals MEMTEST that are output from the three buffers 195 and the control signal MEMTEST that is input from external of the MML device, and an AND gate 199 for performing an AND operation on the control signals MEMTEST that are output from the three buffers 195 and the control signal NORMAL that is input from external of the MML device.

The second selection portion 142 selectively transmits the data that is output from the buffer memory 151 to the third selection portion 143. There are, for example, 128 input data buses DB4 and 16 output data buses DB6 in the second selection portion 142. Therefore, the second selection portion 142 selects sixteen items of data from the 128 items of input data and simultaneously outputs the sixteen data items in response to the output of the selection control portion 191. The selection portion 142 preferably includes sixteen multiplexers each having eight inputs for inputting the output of the buffer memory 151.

The third selection portion 143 selectively transmits the data that is output from the logic circuit 171 and the second selection portion 142 to the data input/output portion 111.

There are, for example, sixteen input data buses DB5, sixteen input data buses DB6, and sixteen output data buses DB7. Therefore, the third selection portion 143 selects either the data output from the logic circuit 171 or the data output from the second selection portion 142 and simultaneously outputs the sixteen items of data in response to the control signals MEMTEST and NORMAL. The third selection portion 143 preferably includes sixteen multiplexers each having two inputs and one output.

The output control portion 181 controls the output buffers 117 of the data input/output portion 111 in response to the control signals MEMTEST and NORMAL that are input from external of the MML device and a control signal TRST that is output from the DRAM 161. The output control portion 181 includes an AND gate 183 and a NOR gate 185. The AND gate 183 inputs the control signal MEMTEST and the control signal TRST and performs an AND operation. Specifically, the AND gate 183 outputs logic low when either the control signal MEMTEST or the control signal TRST is logic low and outputs logic high when the control signal MEMTEST and the control signal TRST are logic high. The NOR gate 185 inputs the output of the AND gate 183 and the control signal NORMAL and performs a NOR operation. Specifically, the NOR gate 185 outputs logic low when either the output of the AND gate 183 or the control signal NORMAL is logic high and outputs logic high when the output of the AND gate 183 and the control signal NORMAL are logic low.

When the output of the NOR gate 185 is logic low, the output buffers 117 are activated and transmit the data output from the third selection portion 143 to the sixteen input and output pads 113. When the DRAM 161 is tested, the control signals MEMTEST and TRST become logic high. The control signals TRST and NORMAL become logic high in a normal operation. When either the control signals MEMTEST and TRST or the control signal NORMAL is logic high, the output of the NOR gate 185 becomes logic low. Specifically, the output buffers 117 are activated only when the DRAM 161 is tested or in the normal operation. When the DRAM 161 is not tested or not in the normal operation, the output buffers 117 are deactivated. Accordingly, the amount of current consumed in the output buffers 117 may be reduced.

As shown in FIG. 1, the number of the data buses input to the buffer memory 151 may be much smaller than the number of the data buses of a conventional MML integrated circuit device for directly testing the DRAM 161. The DRAM 161 and the buffer memory 151 are tested or controlled using the first selection portion 141.

Figure 2:
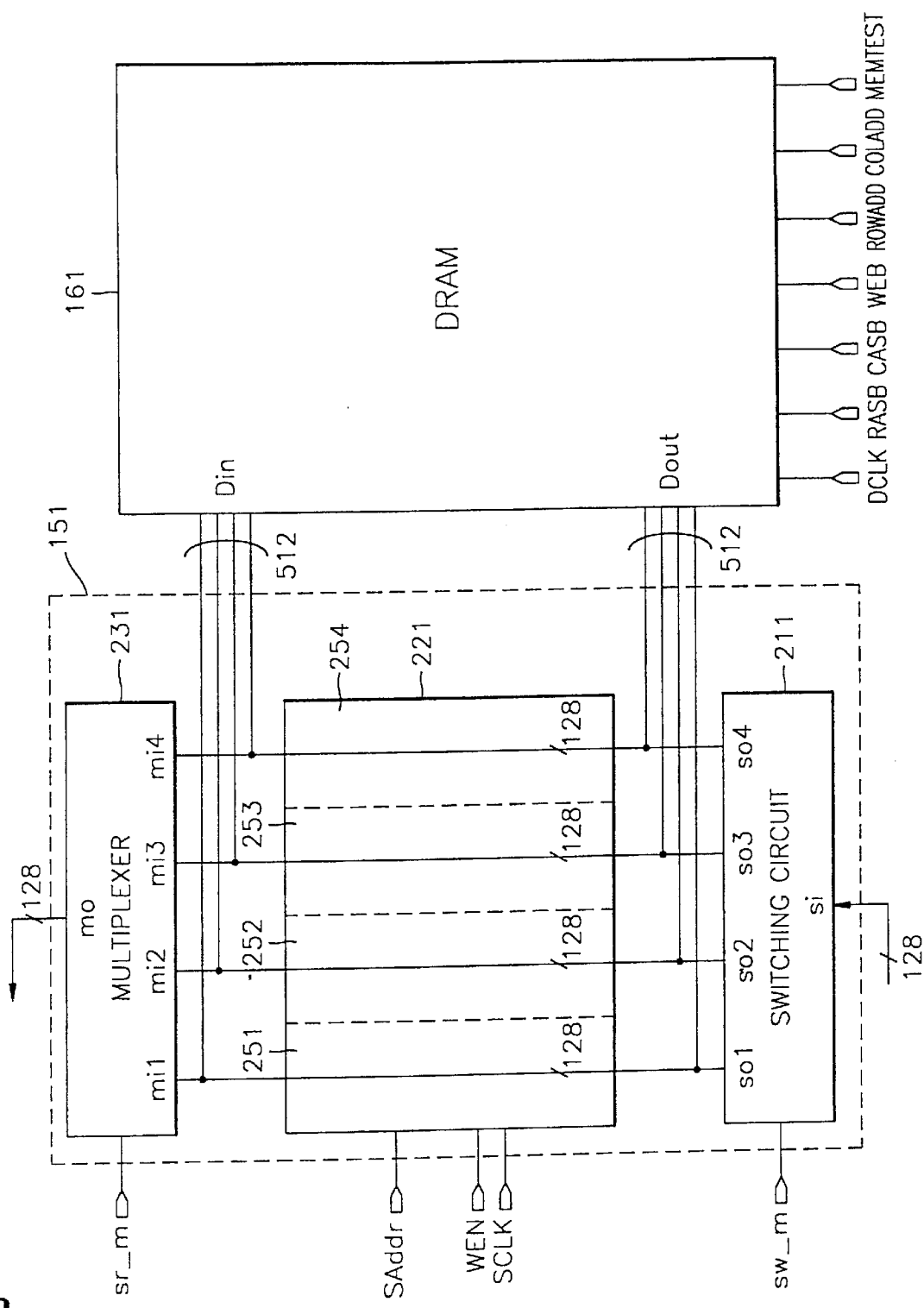
FIG. 2 shows a buffer memory and a memory block of FIG. 1.

FIG. 2 shows the buffer memory 151 and the DRAM 161 of FIG. 1. Referring to FIG. 2, the buffer memory 151 includes a switching circuit 211 in an input port and a multiplexer 231 in an output port. The switching circuit 211 has one input port si and four output ports so1 through so4. The switching circuit 211 selects one of the four output ports so1 through so4 in response to control signals sw_m[1:0] and outputs data to the selected output port. The input port si of the switching circuit 211 is connected to the first and second selection portions 141 and 142, the logic circuit 171, and the BIST circuit 131 through the 128 data buses. In FIG. 2, the four output ports so1 through so4 are connected to a memory array 221 through 128 data buses. The memory array 221 is comprised of four blocks 251 through 254. Each of the four blocks 251 through 254 includes, for example, 128 bit lines. Therefore, the 128 items of data are input to the memory array 221 from switching circuit 211 four times in order to store the data in the buffer memory 151.

The buffer memory 151 stores the data output from the switching circuit 211 in response to the control signals Saddr, WEN, and SCLK. The multiplexer 231 has four input ports mi0 through mi4 and one output port mo and is controlled by the control signals sr_m. The four input ports mi0 through mi4 are connected to 512 bit lines of the memory array 221. Therefore, all the items of data stored in the memory array 221 may be simultaneously transmitted to the multiplexer 231. The multiplexer 231 selectively outputs the data through the one output port mo. For example, the multiplexer 231 receives the 512 items of data and selectively outputs 128 items of data from the received data. Therefore, the multiplexer 231 performs data outputting four times in order to output the 512 items of data.

The 512 bit lines of the memory array 221 are respectively connected to the 512 input and output data buses of the DRAM 161. Therefore, the data stored in the buffer memory 151 can be simultaneously stored in the DRAM 161. The DRAM 161 reads data from the buffer memory 151 or transmits data to the buffer memory 151 in response to the control signals DCLK, MEMTEST, RASB, CASB, WEB, ROWADD, and COLADD. The DRAM 161 of FIG. 2 preferably is a synchronous DRAM which is operated by a clock signal DCLK.

As shown in FIG. 2, there are, for example, 128 input ports mi in the switching circuit 211 and 512 input and output data buses in the DRAM 161. Since the number of the input ports mi of the switching circuit 211 is smaller than the number of the input and output data buses of the DRAM 161, the number of the data buses (DB3 of FIG. 1) connected to the input ports of the buffer memory 151 may be reduced. Accordingly, the size of the MML integrated circuit device may be reduced.

Figure 3:
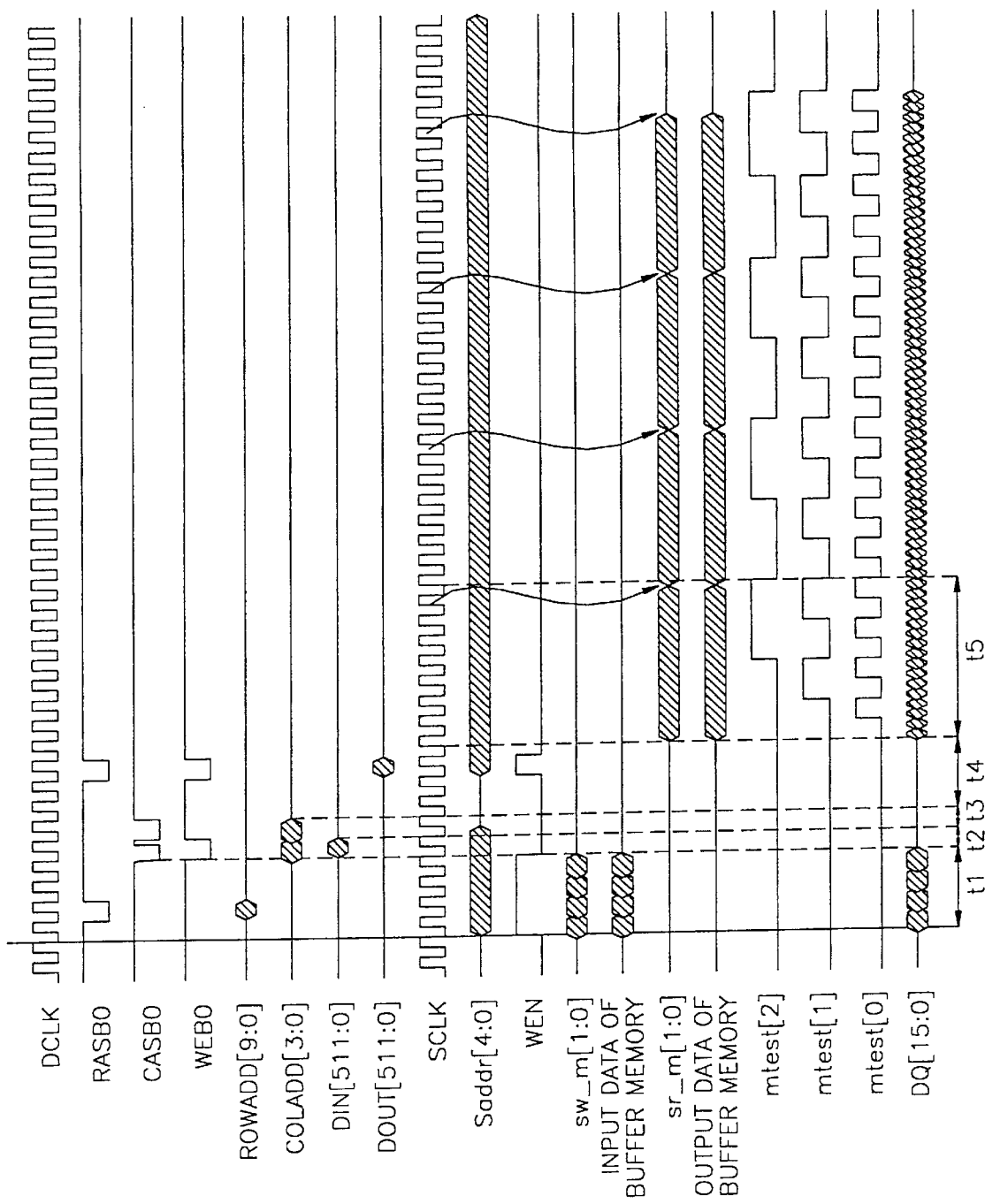
FIG. 3 is a timing diagram of signals for the MML integrated circuit device shown in FIG. 1.
Figure 4:
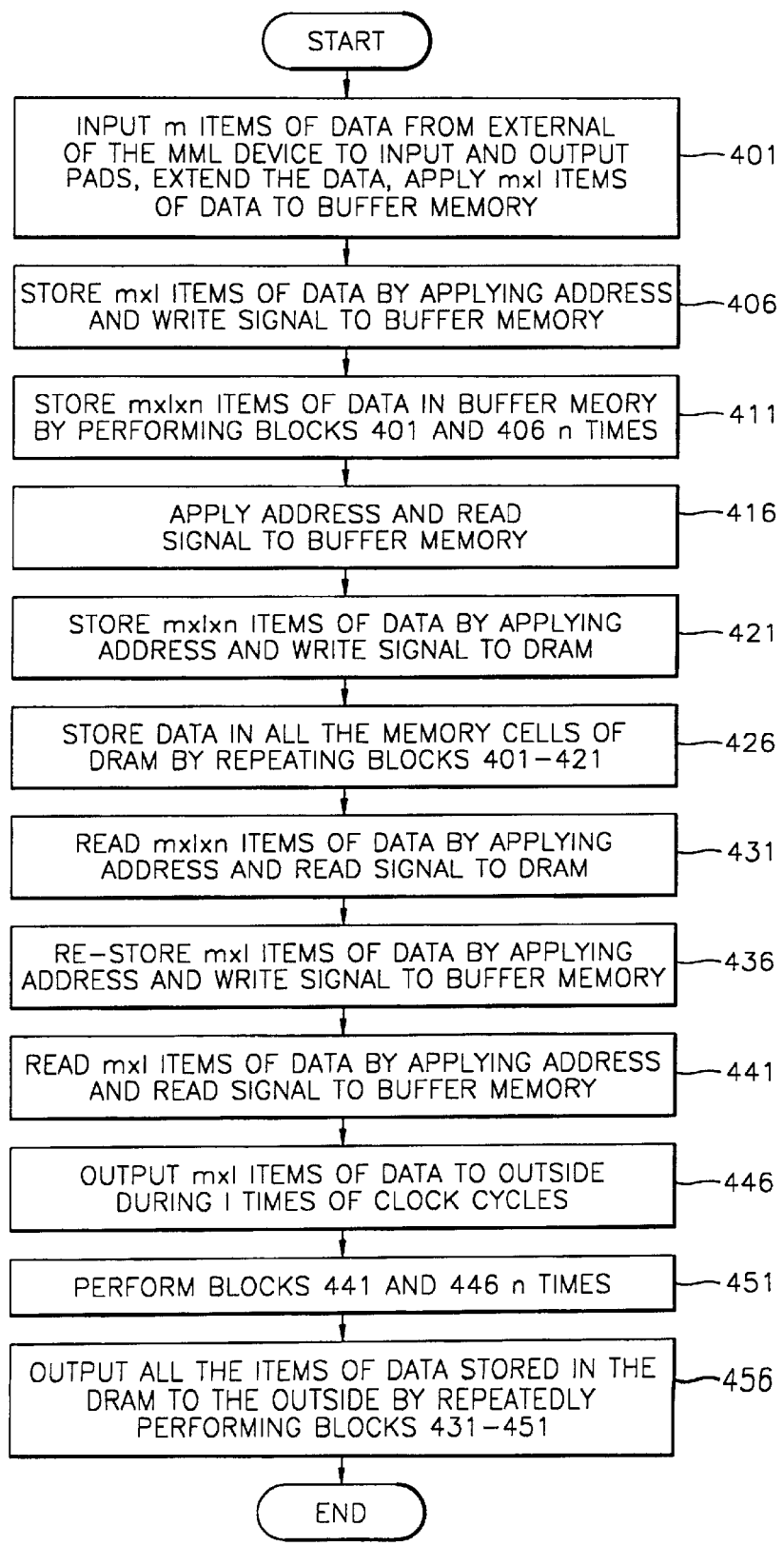
FIG. 4 is a flowchart illustrating methods of detecting errors in the memory block of FIG. 1.

FIG. 3 is a timing diagram of signals for normal operation of the MML integrated circuit device shown in FIG. 1. FIG. 4 is a flowchart illustrating methods for detecting errors in the memory block of FIG. 1. Referring to FIG. 1 through FIG. 3, methods of detecting errors in the DRAM, shown in FIG. 4, will be described.

Before detecting errors in the DRAM 161, errors in the buffer memory 151 are detected. When no error is found in the buffer memory 151, errors in the DRAM 161 are detected.

A method of detecting errors in the buffer memory 151 now will be described. First, processes for storing data in the buffer memory 151 will be described. Sixteen items of data are applied from external of the MML device to the input and output pads 113. The sixteen items of data are extended, for example, to 128 items of data by passing through the data expansion portion 121. The 128 items of data are transmitted to the buffer memory 151 through the first selection portion 141. The 128 items of data are stored in the buffer memory 151 by applying an address signal Saddr and write signals WEN and sw_m from external of the MML device. Then, 512 items of data are stored in the buffer memory 151 by repeating the above processes four times.

Second, processes for reading the 512 items of data stored in the buffer memory 151 will be described. The 128 items of data stored in the buffer memory 151 are read by applying the address signal Saddr and the read signal sr_m from external of the MML device to the buffer memory 151 and are transmitted to the second selection portion 142. The data stored in the second selection portion 142 is output to external of the MML device through the sixteen input and output pads 113 during eight groups of clock cycles by sixteen during one clock cycle. The 512 items of data stored in the buffer memory 151 can be read to external of the MML device by repeating the above processes. It is possible to detect the errors of the buffer memory 151 by comparing the data read to external of the MML device to the external data input to the MML device at the input and output pads 113 and analyzing the two groups of data.

When no errors are detected in the buffer memory 151, errors in the DRAM 161 are detected. When there are errors in the buffer memory 151, the errors in the DRAM 161 may be detected after recovering the errors in the buffer memory 151 using conventional techniques. When errors in the buffer memory 151 are not recoverable, the MML integrated circuit device may be unusable.

Referring to FIG. 4, methods of detecting errors in the DRAM 161 include the steps of storing data to the buffer memory (Blocks 401, 406, and 411), storing in the DRAM (Blocks 416, 421, and 426), reading the DRAM (Blocks 431 and 436), and reading the buffer memory (Blocks 441, 446, 451, and 456).

The step of storing data to the buffer memory includes steps one through three (Blocks 401, 406, and 411). In step one (Block 406), m items of external data, for example sixteen items of external data, are applied to the input and output pads 113. The m items of data are extended to l items of data, for example 128 items of data, by passing through the data expansion portion 121. In step two (Block 406), the address signal Saddr and the write signal WEN are applied from external of the MML device to the buffer memory 151. Then, the l items of data are stored in the buffer memory 151. In step three (Block 411), steps one (Block 401) and two (Block 406) are performed n times, for example four times. In the step three (Block 411), m×l×n items of data, for example 512 items of data, are stored in the buffer memory 151. The steps one through three (Blocks 401, 406, and 411) are preferably performed during four clock cycles (t1 of FIG. 3).

The step of storing the data stored in the buffer memory in the DRAM includes steps four through six (Blocks 416, 421, and 426). In step four (Block 416), the m×l×n items of data are read by applying the address signal Saddr from external of the MML device to the buffer memory 151 and are transferred to the DRAM 161. In step five (Block 421), the m×l×n items of data transmitted from the buffer memory 151 are stored in the DRAM 161 at the same time by applying the address signals COLADD and ROWADD, the control signals RASB and CASB, and the write signal WEB to the DRAM 161. Steps four and five (Blocks 416 and 421) preferably are performed during one clock cycle (t2 of FIG. 3). In step six (Block 426), data is stored in all the memory cells of the DRAM 161 by repeatedly performing steps one through five (Blocks 401, 406, 411, 416, and 421).

The step of reading the data stored in the DRAM and storing the read data in the buffer memory 151 includes steps seven and eight (Blocks 431 and 436). In step seven (Block 431), the m×l×n items of data are read from the data stored in the DRAM 161 by applying the address signals COLADD and ROWADD and the control signals RASB and CASB to the DRAM 161, and are transmitted to the buffer memory 151. In step eight (Block 436), the m×l×n items of data transmitted from the DRAM 161 are re-stored in the buffer memory 151 at the same time by applying the address signal Saddr and the write signals WEN and sw_m to the buffer memory 151. Steps seven and eight (Block 431 and 436) preferably are performed during one clock cycle (t3 of FIG. 3).

The step of outputting the data stored in the buffer memory to external of the MML device includes steps nine through twelve (Blocks 441, 446, 451, and 456). In step nine (Block 441), the address Saddr and the write signal sr_m are applied to the buffer memory 151. Then, m×l items of data, for example 128 items of data, are read from the m×l×n items of data stored in the buffer memory 151 and are transmitted to the second selection portion 142. Step nine (Block 441) preferably is performed in a time t4 of FIG. 3. In step ten (Block 446), the m×l items of data transmitted to the second selection portion 142 are transmitted to external of the MML device through m, for example sixteen, input and output pads 113, during l times of clock cycles by m at one time. The data transmitted to the input and output pads 113 is controlled by the output control portion 181 and is output to external of the MML device. Step ten (Block 446) is performed in a time section t5 of FIG. 3.

In step 11 (Block 451), the m×l×n items of data stored in the buffer memory 151 are output to external of the MML device by repeatedly performing steps nine and ten (Block 441 and 446). In step twelve (Block 456), all the items of data stored in the DRAM 161 are read to external of the MML device by repeatedly performing steps seven through eleven (Block 431 through 451).

It is possible to detect errors in the DRAM 161 by comparing the external data that is input from external of the MML device to the input and output pads 113, with the data read to external of the MML device through the input and output pads 113 and analyzing the two sets of data. Also, it is possible to check the operational speed of the DRAM 161 by analyzing the time taken to input external data to the input and output pads 113 and the time taken for the data to be stored in the DRAM 161 and output to external of the MML device. It is possible to test the DRAM 161 using the BIST circuit 131 by the above-mentioned method.

Accordingly, the number of data buses for detecting errors of the DRAM 161 may be reduced by accessing the DRAM 161 using the input and output data buses of the buffer memory 151, in which the number of the input and output data buses is smaller than that of the input and output data buses in the DRAM 161, without directly accessing the DRAM 161 through the input and output pads 113. Accordingly, the size of the MML integrated circuit device may be reduced. Also, it is possible to correctly check the operational speed of the DRAM 161 during the normal operation of the MML integrated circuit device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A Merged Memory and Logic (MML) integrated circuit device comprising:
   a memory block;
   a logic block;
   a buffer memory that is coupled to the memory block and that operates at a higher speed than the memory block; and
   a first selection portion that is coupled between the logic block and the buffer memory, the first selection portion being responsive to external data and to the logic block to transmit the external data to the memory block via the buffer memory or to transmit data from the logic block to the memory block via the buffer memory.

2. A Merged Memory and Logic (MML) integrated circuit device comprising:
   a memory block;
   a logic block;
   a buffer memory that is coupled to the memory block and that operates at a higher speed than the memory block;
   a first selection portion that is coupled between the logic block and the buffer memory, the first selection portion being responsive to external data and to the logic block to transmit external data or data from the logic block to the memory block via the buffer memory; and
   a Built-In Self-Test (BIST) block that is coupled to the first selection portion to transmit BIST data to the memory block via the buffer memory.

3. An MML integrated circuit device according to claim 2 wherein the first selection portion comprises a plurality of multiplexers, a respective one of which is coupled to the external data, the logic block and the BIST block.

4. A Merged Memory and Logic (MML) integrated circuit device comprising:
   a memory block;
   a logic block;
   a buffer memory that is coupled to the memory block and that operates at a higher speed than the memory block;
   a first selection portion that is coupled between the logic block and the buffer memory, the first selection portion being responsive to external data and to the logic block to transmit external data or data from the logic block to the memory block via the buffer memory; and
   a data expansion portion that is coupled between the external data and the first selection portion, to replicate the external data a predetermined number of times and to transmit the replicated external data to the first selection portion.

5. A Merged Memory and Logic (MML) integrated circuit device comprising:
   a memory block;
   a logic block;
   a buffer memory that is coupled to the memory block and that operates at a higher speed than the memory block;
   a first selection portion that is coupled between the logic block and the buffer memory, the first selection portion being responsive to external data and to the logic block to transmit external data or data from the logic block to the memory block via the buffer memory; and
   a second selection portion that is responsive to parallel data from the buffer memory, to sequentially select portions of the parallel data from the buffer memory and to sequentially output the selected portions of the parallel data to external of the MML integrated circuit device.

6. An MML integrated circuit device according to claim 4 further comprising a second selection portion that is responsive to parallel data from the buffer memory, to sequentially select portions of the parallel data from the buffer memory and to sequentially output the selected portions of the parallel data to external of the MML integrated circuit device.

7. An MML integrated circuit device according to claim 6 further comprising an input/output portion that is coupled to the data expansion portion and to the second selection portion to provide the external data to the data expansion portion and to receive the sequentially selected portions of the parallel data from the second selection portion for output external of the MML integrated circuit device.

8. An MML integrated circuit device according to claim 6 further comprising a third selection portion that is coupled to the logic circuit and to the second selection portion to select the output of the logic circuit or the sequentially selected portions of the parallel data from the second selection portion for output external of the MML integrated circuit device.

9. A Merged Memory and Logic (MML) integrated circuit device comprising:
   a memory block;
   a logic block;
   a buffer memory that is coupled to the memory block and that operates at a higher speed than the memory block; and
   a first selection portion that is coupled between the logic block and the buffer memory, the first selection portion being responsive to external data and to the logic block to transmit external data or data from the logic block to the memory block via the buffer memory;
   wherein the memory block comprises a synchronous Dynamic Random Access Memory (DRAM) and wherein the buffer memory comprises a Static Random Access Memory (SRAM) that is smaller than the synchronous DRAM.

10. A Merged Memory and Logic (MML) integrated circuit device comprising:
    a memory block;
    a logic block;
    a buffer memory that is coupled to the memory block and that operates at a higher speed than the memory block;
    a first selection portion that is coupled between the logic block and the buffer memory, the first selection portion being responsive to external data and to the logic block to transmit external data or data from the logic block to the memory block via the buffer memory;
    a Built-In Self-Test (BIST) block that is coupled to the first selection portion to transmit BIST data to the memory block via the buffer memory; and
    a data expansion portion that is coupled between the external data and the first selection portion, to replicate the external data a predetermined number of times and to transmit the replicated external data to the first selection portion;
    wherein the first selection portion comprises a plurality of multiplexers, a respective one of which is coupled to the logic block, the BIST block and the data expansion portion.

11. An MML integrated circuit device according to claim 10 further comprising a second selection portion that is responsive to parallel data from the buffer memory, to sequentially select portions of the parallel data from the buffer memory and to sequentially output the selected portions of the parallel data to external of the MML integrated circuit device.

12. An MML integrated circuit device according to claim 11 further comprising an input/output portion that is coupled to the data expansion portion and to the second selection portion to provide the external data to the data expansion portion and to receive the sequentially selected portions of the parallel data from the second selection portion for output external of the MML integrated circuit device.

13. An MML integrated circuit device according to claim 12 further comprising a third selection portion that is coupled to the logic circuit and to the second selection portion to select the output of the logic circuit or the sequentially selected portions of the parallel data from the second selection portion for output external of the MML integrated circuit device.

14. An MML integrated circuit device according to claim 10 wherein the memory block comprises a synchronous Dynamic Random Access Memory (DRAM) and wherein the buffer memory comprises a Static Random Access Memory (SRAM) that is smaller than the synchronous DRAM.

15. A method of detecting errors in a Merged Memory and Logic (MML) integrated circuit device that includes a memory block, a logic block and a buffer memory that is coupled to the memory block, the method comprising the steps of:
    storing external data from external of the MML integrated circuit device into the buffer memory;
    storing the external data from the buffer memory into the memory block;
    reading the external data from the memory block;
    storing the read external data from the memory block into the buffer memory; and
    outputting the read external data from the buffer memory to external of the MML integrated circuit device.

16. A method according to claim 15 wherein the step of storing external data from external of the MML integrated circuit device into the buffer memory comprises the steps of:
    applying external data from external of the MML integrated circuit device to the MML integrated circuit device;
    replicating the external data a predetermined number of times in the MML integrated circuit device; and
    storing the replicated external data in the buffer memory.

17. A method according to claim 16:
    wherein the step of storing external data from external of the MML integrated circuit device into the buffer memory is repeatedly performed to fill the buffer memory with the external data; and
    wherein the step of storing the external data from the buffer memory into the memory block is repeatedly performed to fill the memory block with the stored external data from the buffer memory.

18. A method according to claim 15 wherein the step of outputting the read external data from the buffer memory to external of the MML integrated circuit device comprises the steps of:
    sequentially selecting portions of the read external data from the buffer memory; and
    sequentially outputting the selected portions of the read external data to external of the MML integrated circuit device.

19. A method according to claim 15 wherein the step of storing external data from external of the MML integrated circuit device into the buffer memory comprises the steps of:
    applying m×l items of external data to the buffer memory;
    storing the m×l items of external data in the buffer memory by applying an address and a write signal to the buffer memory; and
    applying m×l×n items of external data to the buffer memory by performing the steps of applying m×l items and storing m×l items n times.

20. A method according to claim 19, wherein the step of applying m×l items comprises the steps of:
    applying m items of external data from external of the MML integrated circuit device; and
    extending the m items of data to m×l items of data.

21. A method according to claim 15, wherein the step of reading comprises the step of:
    reading m×l×n items of data from the memory block by applying an address and a read signal to the memory block and applying the read data to the buffer memory; and
    wherein the step of storing the read external data from the memory block into the buffer memory comprises the step of:
    storing m×l×n items of data by applying an address and a write signal to the buffer memory.

22. A method according to claim 21, wherein the step of outputting comprises the steps of:

reading m×l items of data form the buffer memory by applying an address and a read signal to the buffer memory;

outputting the m×l items of data to external of the MML integrated circuit device during 1 groups of clock cycles;

performing the steps of reading m×l items and outputting the m×l items n times; and outputting all the items of data stored in the DRAM to external of the MML integrated circuit device by repeatedly performing the steps of reading m×l×n items, storing m×l×n items, reading m×l items and outputting the m×l items.

* * * * *